United States Patent
Gallup et al.

(10) Patent No.: US 6,955,934 B2
(45) Date of Patent: Oct. 18, 2005

(54) WAFER-LEVEL PACKAGING OF OPTICAL RECEIVERS

(75) Inventors: Kendra Gallup, Marina Del Rey, CA (US); Brenton A. Baugh, Palo Alto, CA (US); Robert E. Wilson, Palo Alto, CA (US); James A. Matthews, Milpitas, CA (US); James H. Williams, Walnut Creek, CA (US)

(73) Assignee: Agilent Technologies, Inc., Palo Alto, CA (US)

( * ) Notice: Subject to any disclaimer, the term of this patent is extended or adjusted under 35 U.S.C. 154(b) by 25 days.

(21) Appl. No.: 10/938,291

(22) Filed: Sep. 9, 2004

(65) Prior Publication Data

US 2005/0062119 A1 Mar. 24, 2005

Related U.S. Application Data

(62) Division of application No. 10/665,660, filed on Sep. 19, 2003.

(51) Int. Cl.[7] .............................................. H01L 21/00
(52) U.S. Cl. ........................................... 438/27; 438/26
(58) Field of Search ........................ 438/27, 26, 31, 438/7, 51, 55, 69, 113

(56) References Cited

U.S. PATENT DOCUMENTS

| | | | | | |
|---|---|---|---|---|---|
| 5,940,564 | A | * | 8/1999 | Jewell | 385/93 |
| 5,981,945 | A | * | 11/1999 | Spaeth et al. | 250/239 |
| 6,243,508 | B1 | * | 6/2001 | Jewell et al. | 385/14 |

* cited by examiner

*Primary Examiner*—David Nelms
*Assistant Examiner*—Thinh T Nguyen

(57) ABSTRACT

A sub-assembly or package for a die in the receiving section of an optical transceiver includes a semiconductor sub-mount that is electrically connected to the die and a cap that is bonded to the sub-mount to hermetically seal the die in a cavity. The die can be flip-chip bonded to the sub-mount and can include a diffractive optical element fabricated on a back side of the die. Active circuitry such as an amplifier for an output signal from a photosensor on the die can be integrated into the sub-mount. For an OSA, a post can be attached to the package along a path of an optical signal to the photosensor. The post facilitates alignment of an optical fiber. A flexible or rigid circuit can be soldered to external terminals of the sub-mount.

15 Claims, 4 Drawing Sheets

WAFER-LEVEL PACKAGING OF OPTICAL RECEIVERS

This application is a divisional of Application 10/665,660 Sep. 19, 2003.

This patent document is related to and hereby incorporates by reference in their entirety the following co-filed U.S. patent applications: Ser. No. 10/666,319, entitled "Alignment Post for Optical Subassemblies Made With Cylindrical Rods, Tubes, Spheres, or Similar Features", Ser. No. 10/666,363, entitled "Wafer Level Packaging of Optoelectronic Devices", Ser. No. 10/666,442, entitled "Integrated Optics and Electronics", Ser. No. 10/666,444, entitled "Methods to Make Diffractive Optical Elements", Ser. No. 10/666,091, entitled "Optoelectronic Device Packaging With Hermetically Sealed Cavity and Integrated Optical Element", Ser. No. 10/665,680, entitled "Optical Device Package With Turning Mirror and Alignment Post", and Ser. No. 10/665,662, entitled "Surface Emitting Laser Package Having Integrated Optical Element And Alignment Post".

BACKGROUND

Semiconductor optoelectronic devices such as laser diodes for optical transmitters and photosensors for optical receivers can be efficiently fabricated using wafer processing techniques. Generally, wafer processing techniques simultaneously form a large number (e.g., thousands) of devices on a wafer. The wafer is then cut to separate individual chips. Simultaneous fabrication of a large number of chips keeps the cost per chip low, but each individual chip must be packaged and/or assembled into a system that protects the chip and provides both electrical and optical interfaces for use of the devices on the chip.

Assembly of a package or optical subassembly (OSA) containing a semiconductor optoelectronic device is often costly because of the need to align multiple optical elements with the semiconductor device. For example, the receiver side of an optical transceiver chip may include a sensor that receives an optical signal from an optical fiber and converts the optical signal into an electrical signal. Additional optical elements may be required between the optical fiber and the sensor to focus the optical signal on the photosensitive portion of the sensor. Alignment of the sensor, the optical fiber, and the intervening optics can be a time consuming and expensive process. Further, the alignment and assembly processes generally must be performed separately for each package.

Wafer-level packaging is a promising technology for reducing the size and the cost of the packaging for integrated circuits. With wafer-level packaging, components that conventionally have been separately formed or attached to separate packages are instead fabricated on or applied to a wafer that corresponds to multiple packages. The resulting structure can be cut up to separate individual packages. Packaging techniques and structures that can reduce the size and/or cost of packaged optoelectronic devices are sought.

SUMMARY

In accordance with an aspect of the invention, a package for an optoelectronic device encloses a sensor in a cavity formed between a sub-mount and a cap. The sub-mount can include passive or active electrical components that are connected to the sensor. In particular, the sub-mount can include traces that supply power to the sensor and an amplifier circuit for an electric data signal output from the sensor. The cap includes a depression that forms the cavity enclosing the chip, and the cavity can be hermetically sealed to protect the chip from the environment. The package further includes a post that is on the cap over the photosensitive area of the sensor, and the post acts as an alignment feature.

The post can be sized to fit into a sleeve that also accommodates an optical fiber connector. Inserting the post into one end of the sleeve and the optical fiber connector into the other end of the sleeve provides an aligned optical connection. With the optical fiber abutting the post, the length of the post controls a separation of the optical fiber and the sensor, and a close fit of the post and the connector in the sleeve controls alignment. Accordingly, assembling a receiver optical subassembly (ROSA) does not require a complex alignment process.

In accordance with another aspect of the invention, a lens that focuses light onto the photosensitive area of the sensor can be integrated onto the chip containing the sensor. In one specific embodiment, a flip-chip bonding process attaches the chip to the sub-mount so that a back face of the chip is toward the source of the optical signal. The lens can then be formed on the back face of the chip to focus the input optical signal onto the photosensitive area of the sensor.

One specific embodiment of the invention is a device including a sub-mount, a die, a cap, and an alignment post. The die includes a photosensor that is electrically connected to the sub-mount. The cap is attached to the sub-mount so as to form a cavity, preferably a hermetically sealed cavity, enclosing the die, and the alignment post is attached to the cap and overlying a sensor area of the photosensor. A sleeve having a bore sized to closely accommodate the alignment post at one end of the bore can also accommodate an optical fiber connector at the other end of the bore, to thereby align the photosensor with the optical fiber providing a received optical signal.

The die can be attached to bonding pads on the sub-mount so that a front face of the die is adjacent the sub-mount. A lens formed on a back face of the die then focuses a received signal through the die onto a photosensitive area of the photosensor. Alternatively, a lens can be integrated into the cap between the alignment post and the photosensitive area of the photosensor.

The sub-mount can be fabricated using wafer processing techniques and typically includes internal terminals that are within the cavity and electrically connected to the die and external terminals that are accessible outside the cavity and are electrically connected to the internal terminals. The external terminals of the sub-mount can be directly connected to a flexible or rigid circuit board. The sub-mount may further include an active circuit that operates on an electrical output signal of the photosensor. In particular, the active circuit in the sub-mount can include an amplifier.

Another specific embodiment of the invention is a device including a sub-mount, a cap, and a die. A front face of the die has a photosensitive area for a photosensor on a front face of the die and a lens formed on a back face of the die. The lens can be a refractive optical element that focuses light through the die onto the sensitive area. The die is electrically attached to the sub-mount so that the front face and the sensitive area of the die are adjacent the sub-mount. The cap attaches to the sub-mount so as to form a cavity enclosing the die, but the cap transmits an optical signal to the lens in the cavity. Optionally, a post can be attached to the cap along an optical path to the photosensor.

Yet another specific embodiment of the invention is a device including a semiconductor sub-mount and a die that includes a photosensor. The semiconductor sub-mount includes an active circuit such as an amplifier that can be integrated into the semiconductor sub-mount using integrated circuit processing. The photosensor on the die is electrically connected to the active circuit, permitting the active circuit to amplify or otherwise handle an output signal from the photosensor. Attaching a cap to the sub-mount encloses the die in a cavity.

Another specific embodiment of the invention is a process for fabricating a package containing a photosensor. The process includes fabricating a first wafer that includes multiple sub-mount areas and electrically connecting dice respectively to the sub-mount areas. Caps are bonded to the first wafer to enclose the dice in respective cavities between the first wafer and the respective caps. Each die contains a photosensor positioned to receive an optical signal received through the cap. The resulting structure is divided to separate packages containing the dice.

The first wafer can be fabricated to include an active circuit such as an amplifier in each of the sub-mount areas. The dice can be formed by: processing a substrate to form sensors with photosensitive areas at a front face of the substrate and form lenses on a back face of the substrate. The lenses focus light respectively onto the photosensitive areas. The caps can be formed as areas of a second wafer, so that bonding the caps to the first wafer comprises bonding the second wafer to the first wafer. After dividing the structure to form separate packages, alignment posts can be attached to the packages along paths of optical signals to the dice in the packages.

Another embodiment of the invention is a process for fabricating a device. The process includes: processing a substrate to form a sensor having a photosensitive area at a front face of the substrate; and forming on a back face of the substrate a lens that focuses an optical signal on the photosensitive area.

BRIEF DESCRIPTION OF THE DRAWINGS

Use of the same reference symbols in different figures indicates similar or identical items.

DETAILED DESCRIPTION

In accordance with an aspect of the invention, a receiver portion of an optical transceiver includes a package in which a sensor is enclosed in a cavity. The cavity can be formed between a cap and a sub-mount, where the cap includes a portion that is transparent to the frequency of light used in a received optical signal. Flip-chip techniques can attach the sensor to the substrate with a photosensitive area of the sensor near the sub-mount and a lens on a back surface of the sensor. An alignment post can be attached to the cap over the photosensitive area so that an optical fiber aligned with the post will convey a received signal to the sensor.

The package can be formed using a wafer-level packaging process, in which sub-mounts are formed in a sub-mount wafer and caps are formed in a cap wafer. Multiple dice are attached to the sub-mount wafer before the cap wafer is bonded to the sub-mount wafer. The bonded structure can then be cut to separate individual packages.

Figure 1:
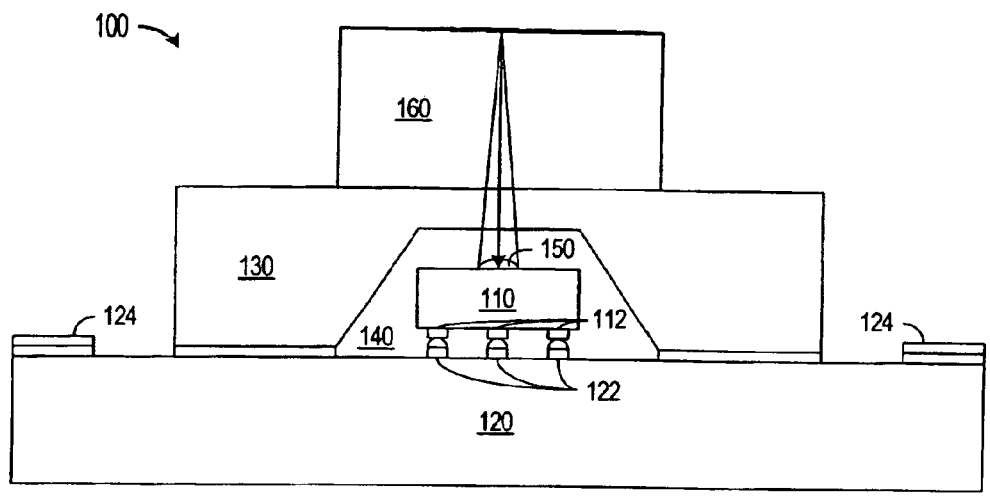
FIG. 1 is a cross-sectional diagram of a receiver optical sub-assembly (ROSA) in accordance with an embodiment of the invention using flip-chip electrical connections to a sensor.

FIG. 1 shows an optical subassembly or package 100 in accordance with an exemplary embodiment of the invention. Package 100 includes a sensor 110 that is electrically connected to a sub-mount 120. Sensor 110 is an optoelectronic sensor capable of receiving an optical signal and converting the optical signal to an electric signal. Optoelectronic sensors of this type are well known in the art and commonly employed in optical transceivers.

In package 100, sensor 110 is attached to sub-mount 120 using flip-chip packaging techniques. In particular, sub-mount 120 includes conductive pillars or bumps 122 that are in the same pattern as bond pads 112 on sensor 110. Bumps 122 and bond pads 112 contact each other and can be attached using a solder reflow process. An underflow resin (not shown) can be applied to improve the mechanical integrity of the attachment of sensor 110 to sub-mount 120. With the flip-chip techniques, a front face of sensor 110 is adjacent the top surface of sub-mount 120.

Sub-mount 120 is preferably a substrate that can be fabricated using conventional integrated circuit fabrication processes. Sub-mount 120 in particular includes conductive pillars 122 for flip-chip bonding to sensor 110, external terminals 124 for external electrical connections, and conductive traces (not shown). As disclosed further below, sub-mount 120 can further include active circuit elements, for example, an amplifier useful in the operation of sensor 110.

A cap 130 attached to sub-mount 120 forms a cavity 140 containing sensor 110. In an exemplary embodiment of the invention, a layer of solder between cap 130 and sub-mount 120 bonds cap 130 and sub-mount 120 to hermetically seal cavity 140 and thereby protect sensor 110 from the external environment. Alternatively, cap 130 and sub-mount 120 can be bonded using an adhesive, thermal compression bonding, or any other technique that provides the desired seal to cavity 140.

Cap 130 provides an optical path for a received optical data signal that the sensor on sensor 110 converts into an electrical data signal. Accordingly, at least a portion of cap 130 is transparent to the wavelength of light used in the optical signal. Cap 130 can be made of silicon for a relatively long wavelength (e.g., about 1100 nm or longer) since silicon is transparent to longer wavelength light. When silicon is employed, conventional semiconductor device fabrication processes can simultaneously form a larger number of caps 130 by etching a silicon wafer to form depressions corresponding to cavity 140.

Package 100 also includes a lens 150 that focuses a received optical signal onto a photosensitive area of sensor 110. For the configuration of package 100, the front surface of sensor 110 on which bonding pads 112 and the photosensitive area (not shown) are formed is adjacent to sub-mount 120, and lens 150 is on the back surface of sensor 110. Lens 150 thus focuses the optical signal through the die containing sensor 110 onto the photosensitive area, and the focal length of lens 150 is selected according to the thickness of the die.

In accordance with an aspect of the invention, lens 150 can be fabricated on the back surface of a wafer from which sensor 110 is cut. Lens 150 is preferably fabricated using semiconductor device fabrication processes. In one embodiment of the invention, a process for forming lens 150 begins by forming a photoresist region in the area of lens 150. Heating can then cause the photoresist region to melt and form a bead having the desired shape of a lens. The photoresist can then be hardened to form lens 150 out of photoresist. Alternatively, reactive ion etching (RIE) or another anisotropic etching process that removes the photoresist at about the same rate as the material of the underlying wafer can remove the photoresist region and transfer the lens shape of the photoresist region to the surface of the wafer. An advantage of transferring the lens shape to the underlying wafer is that the resulting lens 150 is made of the wafer material (e.g., silicon), which may have a much higher refractive index than does the photoresist.

A post 160 is attached (e.g., epoxied or glued) to cap 130 overlying lens 150. A positioning and attachment process for post 160 can generally use visual cues to position post 160 over lens 150 with sufficient accuracy. However, an alternative process transmits an optical signal through post 160 during testing of package 100 and moves post 160 as required to output a suitable electrical signal.

Post 160 act as an alignment feature that simplifies fabrication of an optical assembly including package 100. In one embodiment of the invention, post 160 is a hollow cylinder having inner diameter larger than the beam profile expected for the received optical signal. Post 160 can thus be made of any suitably durable material such as a metal or silicon. Alternatively, post 160 can be a solid structure such as a cylinder or a sphere of an optically transparent material that provides a light path. Alignment posts for packages containing optical devices are further described in a co-filed U.S. Pat. App. Ser. No. 10/666,319, entitled "Alignment Post for Optical Subassemblies Made With Cylindrical Rods, Tubes, Spheres, or Similar Features".

Figure 2:
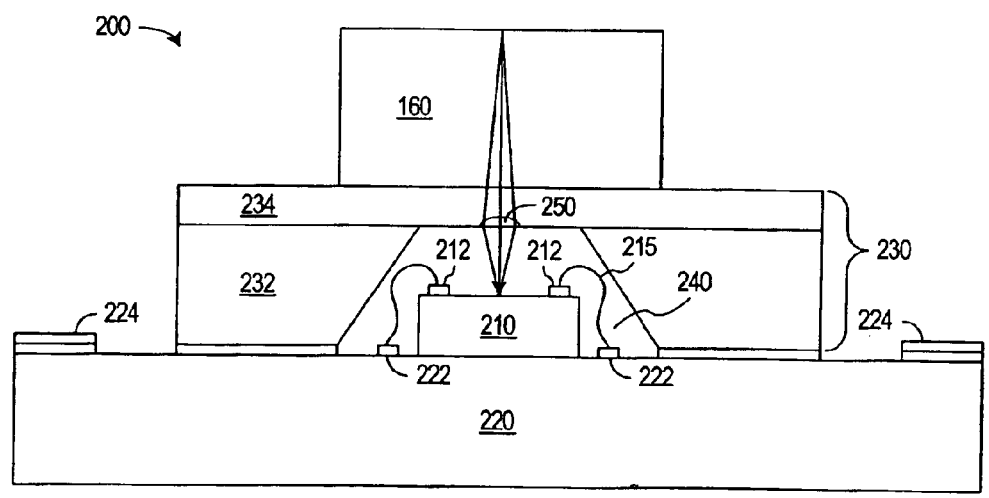
FIG. 2 is a cross-sectional diagram of a ROSA in accordance with an embodiment of the invention using wire-bonded electrical connections to a sensor.

FIG. 2 shows a package 200 in accordance with an embodiment of the invention using wire bonding for electrical connection of a sensor 210 to a sub-mount 220. Like sensor 110, sensor 210 is an optoelectronic device capable of converting an optical signal to an electric signal, but sensor 210 is on a die having bonding pads 212 that are designed for wire bonding. Bond wires 215 thus connect bonding pads 212 on sensor 210 to bonding pads 222 on sub-mount 220. Conductive traces and/or active circuit elements connect bonding pads 222 to external terminals 224.

With wire bonding, the back surface of sensor 210 is adjacent to sub-mount 220, and a lens 250 can be integrated into a cap 230 to focus the received optical signal onto the photosensitive area. This configuration avoids transmitting the optical signal through sensor 210, which is preferable for shorter wavelengths of light. In particular, silicon is opaque for shorter wavelengths. To transmit shorter wavelengths, cap 230 includes a plate 234 of glass or another material that is transparent to the wavelength of the optical signal. A standoff ring 232, which may be formed of silicon using standard wafer processing techniques, defines cavity 240.

Separate processing of standoff ring 232 and plate 234 is also beneficial when the optical signal uses wavelengths for which silicon is transparent. In particular, for long wavelengths, plate 234 can be silicon substrate that is processed using conventional wafer processing techniques to form an optical element 250 such as a diffractive lens. Standoff ring 232 can then be made of metal, silicon, or any other material that is chemically and mechanically suitable.

Figure 3A:
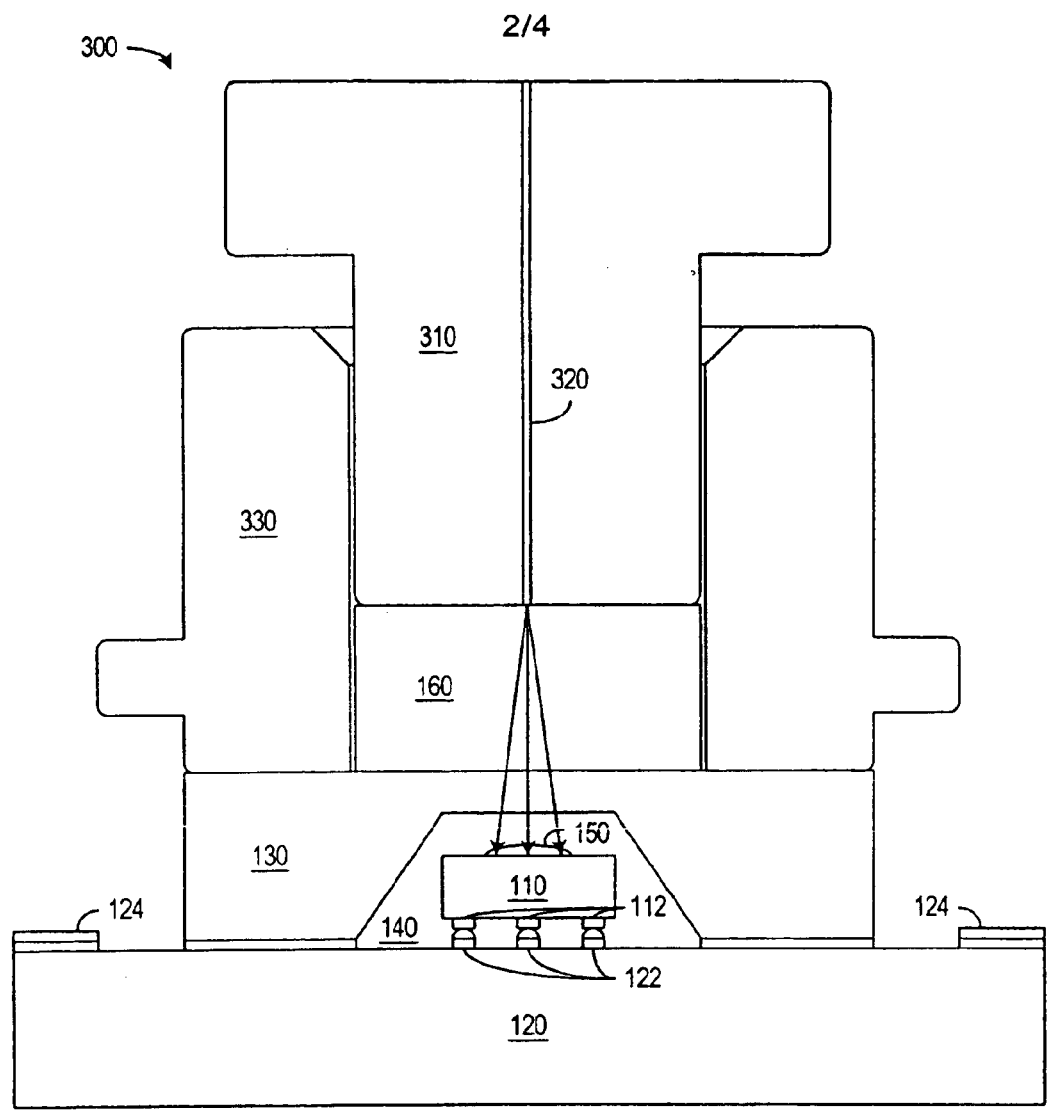
FIG. 3A shows an optical assembly including the ROSA of FIG. 1.

Package 200, like package 100, includes a post 160 for alignment of the package in an optical assembly. FIG. 3A shows a portion of an optical assembly 300 containing package 100. Optical assembly 300 includes an optical fiber connector including an optical fiber 320 in a ferrule 310. The optical fiber connecter can be a conventional connector, which is commercially available from any of a variety of sources. Accordingly, ferrule 310 commonly has a diameter of about 1.25 or 2.5 mm. A sleeve 330, which is basically a hollow cylinder made of metal, plastic, or any other suitably durable material, accepts both post 160 of package 100 and optical fiber 320.

The top surface of post 160 acts as a fiber stop and controls the "z" positions of optical fiber 320 relative to the photosensitive area on sensor 110. The outside diameter of post 160 and the ferrule 310, which fit snugly in sleeve 330, dictates the position in an x-y plane of post 160 and optical fiber 320. In this way, optical fiber 320 is centered on post 160, thereby centering the received light signal from optical fiber 320 on lens 150. Accordingly, proper positioning of a post 160 having the desired length during manufacture of package 100 simplifies alignment of optical fiber 320 for efficient coupling of the optical signal from optical fiber 320 to sensor 110.

Figure 3B:
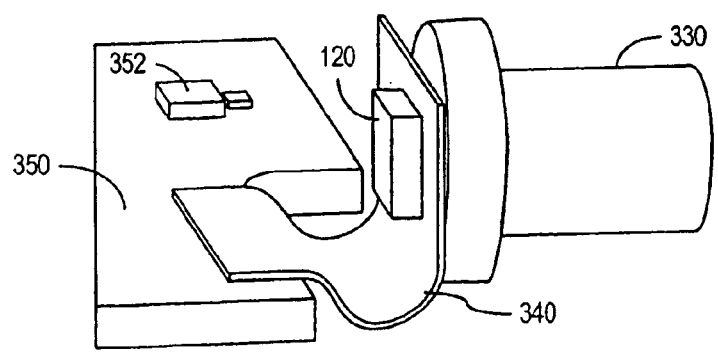
FIG. 3B shows the optical assembly of FIG. 3A with connections to a rigid circuit board via a flexible circuit.

External terminals 124 of assembly 300 are generally connected to a circuit board containing other components of an optical receiver or an optical transceiver. FIG. 3B shows an embodiment of the invention in which terminals 124 connect to a flex circuit 340. Flex circuit 340 is generally a flexible tape or substrate containing conductive traces that can be soldered to external terminals 124 in a conventional manner. A hole can be made through flex circuit 340 to accommodate cap 130 and/or post 160. A rigid circuit board 350 on which other components 352 of the optical receiver or transceiver are mounted electrically connects to the sensor through flexible circuit 340 and sub-mount 120. In an alternative embodiment of the invention, external terminals 124 of OSA 300 can be directly connected to a rigid circuit board, provided that the resulting orientation of sleeve 330 is convenient for connection of an optical fiber connector.

Figure 4:
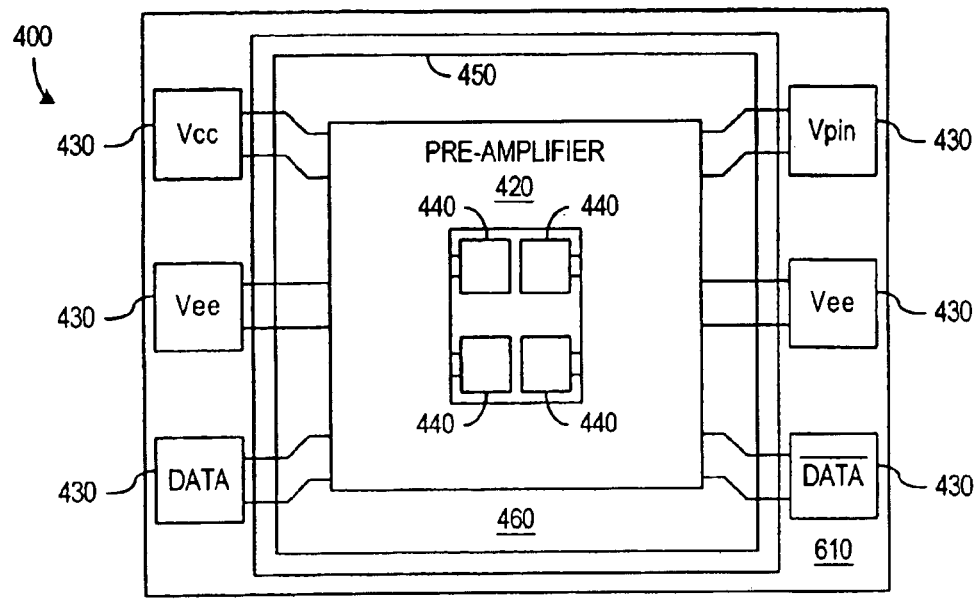
FIG. 4 shows a layout of a sub-mount in accordance with an embodiment of the invention including integrated active circuitry in the sub-mount.

The sub-mounts in the packages described above can incorporate passive or active circuitry. FIG. 4 illustrates the layout of a sub-mount 400 including a substrate 410 on which a pre-amplifier circuit 420 has been fabricated. Pre-amplifier circuit 420 can operate on output data signals from the sensor on a die attached to sub-mount 400. Substrate 410 is a semiconductor substrate on which standard IC processing techniques can fabricate pre-amplifier circuit 420. Once pre-amplifier circuit 420 is laid down, bond pads 430 for connecting to the outside world and flip-chip pads 440 for attaching the optoelectronic device die are formed and connected to preamplifier circuit 420.

In the embodiment illustrated in FIG. 4, external pads 630 accommodate I/O signals such as a power supply signal Vcc, a negative or ground voltage Vee, a regulated voltage Vpin for a PIN photodiode to be connected to internal pads 440, and complementary output data signals DATA and $\overline{\text{DATA}}$. Pre-amplifier 420 can operate to convert an analog output from the PIN photodiode to complementary digital data signals DATA and $\overline{\text{DATA}}$ that may be at or below the normal CMOS levels.

A solder ring 450 for attaching a cap is formed between preamplifier circuit 420 and external bond pads 430. An individual cap sized to permit access to external bond pads 430 can be attached to solder ring 450. Alternatively, in a wafer-level packaging process where multiple caps are fabricated in a cap wafer, the cap wafer is attached to a sub-mount wafer. A partial etching of the cap wafer forms saw channels on the side of the cap wafer bonded to the sub-mount wafer, and permits sawing of the cap wafer from the opposite side without damaging underlying structures. Caps 130 and 230 of FIGS. 1 and 2 can similarly be fabricated using wafer-processing techniques. In particular for longer light wavelengths, etching a silicon wafer to form the cavities and the saw channels can form a cap wafer.

Figure 5A:
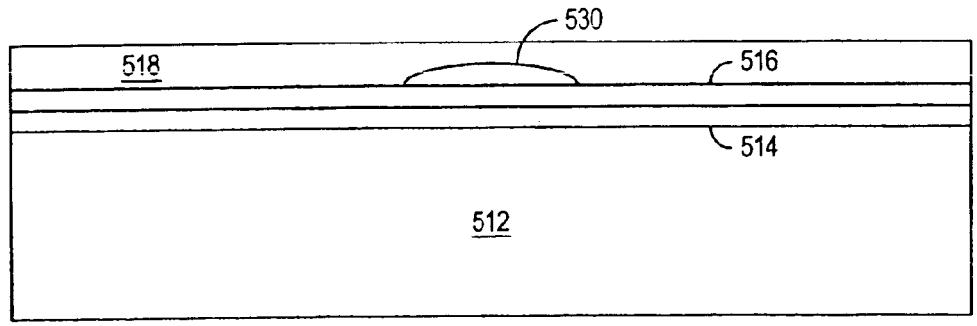
FIGS. 5A, 5B, and 5C illustrate a process for fabricating a cap for a package in accordance with an embodiment of the invention.
Figure 5B:
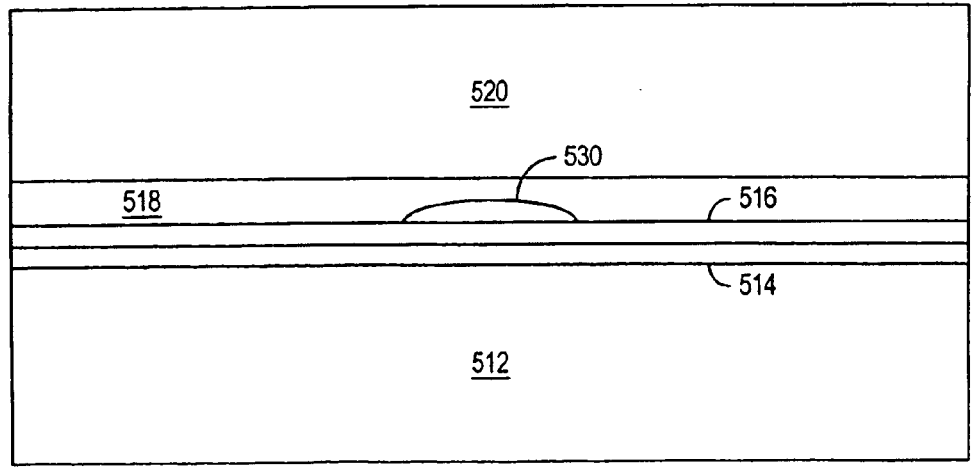
Figure 5C:
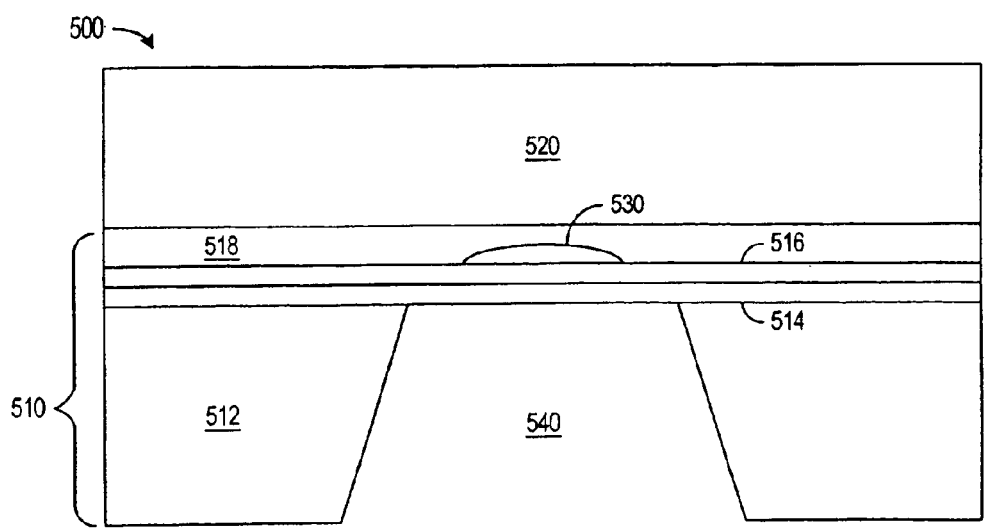

FIGS. 5A, 5B, and 5C illustrate a process for forming a cap 500 including a standoff ring 510 and a backing plate 520. As noted above, an advantage of multilayered cap such as cap 500 is that the layers 510 and 520 can be processed differently and/or made of different materials. In particular, standoff ring 510 can be fabricated using standard silicon wafer processing, and plate 520 can be made of a material such as glass that is transparent to a desired light wavelength. This is important because current VCSELs typically produce light having a wavelength (e.g., 850 nm) that silicon absorbs, and wafers made of materials such as glass (e.g., containing sodium) may be unsuitable for many silicon wafer fabrication facilities.

FIG. 5A illustrates a structure created during fabrication of standoff ring 510. The fabrication process begins with a thin silicon substrate 512 (e.g., a 275 μm thick silicon wafer). A layer 514 of silicon dioxide (SiO2) or other material capable of acting as an etch stop for silicon is formed to a thickness of about 0.5 μm on substrate 512.

A thin polysilicon layer 516 (e.g., about 1 μm or less) is then deposited on etch stop layer 514. Polysilicon layer 516 acts as a base for formation of an optical element 530 but is thin enough to be transparent to the light wavelength used in the received optical signal. In the illustrated example, lens 530 is formed on layer 516, for example, by building up alternating layers of polysilicon and oxide to achieve the desired shape or characteristics of a diffractive or refractive lens.

A planarized transparent layer 518 of a material such as TEOS is deposited over lens 530 to provide a flat surface for bonding to backing plate 520. Backing plate 520 is made of glass or other transparent material and is bonded to layer 518, for example, by anodic bonding when backing plate 520 is made of a sodium glass. Finally, a portion of the back side of substrate 512 is etched down to etch stop layer 512 to form a cavity 540 as illustrated in FIG. 5C. The thickness of silicon remaining above cavity 540 is thin and permits light of the desired wavelength to traverse optical element 530.

Bonding of plate 520 and etching of substrates 510 and 520 would generally be completed at the wafer level, where a large number of caps 500 are simultaneously formed. Separate caps 500 can then be cut from the bonded wafers either before or after bonding to a sub-mount.

Figure 6:
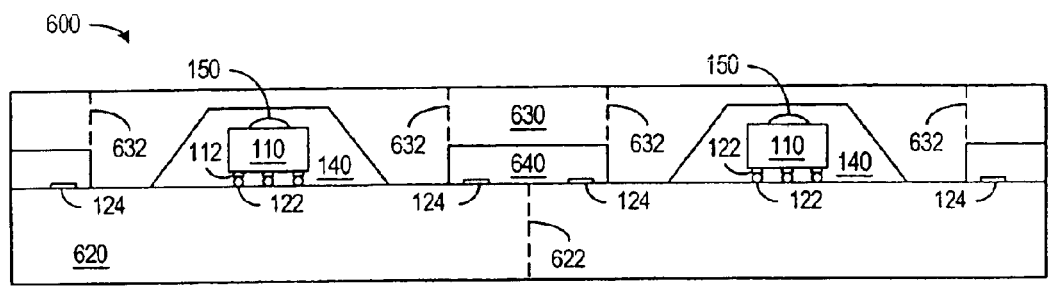
FIG. 6 shows a cross-section of a portion of a structure formed during a wafer-level packaging process in accordance with an embodiment of the invention employing flip-chip structures for electrical connections.

FIG. 6 shows a structure 600 produced during a wafer-level packaging process in accordance with one embodiment of the invention. Structure 600 includes multiple sensors 110 for optical signals. Each sensor 110 is within one of the cavities 140 formed between a sub-mount wafer 620 and a cap wafer 630. Sensors 110 are affixed and connected in the desired locations of sub-mount wafer 620 using conventional flip-chip packaging equipment. Optical elements 150 such as lenses or prisms can be attached to or integrated into the back surface of each sensor 110.

Sub-mount wafer 620 includes circuit elements for multiple sub-mounts. For each sub-mount, bonding pads 122 and electrical traces or vias (not shown) connect the associated sensor 110 to respective external terminals 124. FIG. 6 shows an embodiment where external terminals 124 are on the top surface of sub-mount wafer 120, but alternatively external terminals could be provided on a bottom surface of the sub-mount wafer. Additionally, active devices (not shown) such as an amplifier described in regard to FIG. 4 can be incorporated in sub-mount wafer 620.

Cap wafer 630 is fabricated to include depressions or cavities 140 in areas corresponding to sensors 110 on sub-mount wafer 620. Cap wafer 630 includes silicon, quartz, glass, or any material that is transparent to the optical signal and is suitable for formation of cavities 140. Cavities 140 can be formed in a variety of ways including but not limited to forming, coining, ultrasonic machining, and (isotropic, anisotropic, or plasma) etching. Alternatively, cap wafer 630 can be a multilayer structure such as described in regard to FIGS. 5A, 5B, and 5C, and cap wafer 630 can further include integrated optical elements such as a lens (not shown).

Sub-mount wafer 620 and cap wafer 630 are aligned and bonded together. A variety of wafer bonding techniques including thermal bonding, soldering, and gluing are known and could be employed for attaching wafers 620 and 630. In the exemplary embodiment of the invention, soldering using a gold/tin eutectic solder attaches wafers 620 and 630 to each other and hermetically seals cavities 140. Hermetic seals on cavities 140 protect the enclosed dice 110 from environmental damage.

After wafers 620 and 630 are bonded, structure 100 can be cut to produce individual packages, each including a sensor 110 hermetically sealed in a cavity 140. As illustrated in FIG. 6, saw channels 640 can be formed in cap wafer 630 to permit sawing of wafer 630 over external terminals 124, without damaging external terminals 124. Lines 632 indicate the locations of cuts in cap wafer 630. Sub-mount wafer 620 can then be cut at lines 622 to separate individual packages.

Although the invention has been described with reference to particular embodiments, the description is only an example of the invention's application and should not be taken as a limitation. Various adaptations and combinations of features of the embodiments disclosed are within the scope of the invention as defined by the following claims.

What is claimed is:

1. A method for fabricating a package containing a photosensor, comprising:
    fabricating a wafer that includes a plurality of sub-mount areas;
    attaching and electrically connecting a plurality of dice respectively to the sub-mount areas, wherein each of the dice contains a photosensor;
    bonding a plurality of separated caps to the wafer, wherein the dice are enclosed in respective cavities between the wafer and the respective caps, and for each of the dice, the photosensor on the die is positioned to receive an optical signal; and
    dividing the resulting structure to separate a plurality of packages containing the dice.

2. The method of claim 1, wherein fabricating the wafer comprises forming an active circuit in each of the sub-mount areas.

3. The method of claim 2, wherein the active circuit is an amplifier for an output signal of the photosensor connected to the sub-mount area.

4. The method of claim 1, further comprising:

processing a substrate to form the photosensor including a photosensitive area in the substrate and at a front face of the substrate; and forming a lens on a back face of the substrate to focus light onto the photosensitive area.

5. The method of claim 1, further comprising attaching posts to the packages, wherein each post is along a path of an optical signal to the die in the package.

6. The method of claim 1, further comprising affixing a post to one of the packages, wherein the post is along an optical path of the optical signal into the cavity.

7. The method of claim 1, wherein:

attaching and electrically connecting a die from the plurality of the dice to the respective one of the sub-mount areas comprises connecting terminals of the die to internal bond pads in the sub-mount area, wherein circuitry of the wafer connects the internal terminals to external terminals on the wafer; and bonding the cap attaches the caps to the wafer so that the external terminals are outside the caps.

8. The method of claim 1, wherein attaching and electrically connecting the dice comprises flip-chip bonding the dice to the wafer.

9. The method of claim 8, wherein the photosensor in each of the dice receives an optical signal that passes through a back face of the die to a photosensitive area on a front face of the die.

10. A method for fabricating a package containing a photosensor, comprising:

fabricating a first wafer that includes a plurality of sub-mount areas, wherein each sub-mount area include internal bond pads, external bond pads, and circuitry that connects the internal ho d pads to the external bond pads;

attaching and electrically connecting a plurality of dice respectively to the sub-mount areas, wherein each of the dice contains a photosensor and is electrically connected to the internal bond pad in the corresponding one of the sub-mount areas;

bonding a second wafer to the first wafer to form a set of first cavities and a set of second cavities between the first wafer and the second wafer, wherein the first cavities respectively enclose the dice, and the external terminals are within the second cavities; and dividing the first wafer and the second wafer to separate a plurality of packages in which the first cavities are intact and enclose the dice, and the external terminals are exposed.

11. The method of claim 10, wherein fabricating the first wafer comprises forming an active circuit in each of the sub-mount areas.

12. The method of claim 11, wherein the active circuit is an amplifier for an output signal of the photosensor connected to the sub-mount area.

13. The method of claim 10, wherein attaching and electrically connecting the dice comprises flip-chip bonding the dice to the first wafer.

14. The method of claim 13, wherein the photosensor in each of the dice receives an optical signal that passes through a back face of the die to a photosensitive area on a front face of the die.

15. The method of claim 10, wherein dividing the first wafer and the second wafer comprises:

dividing the first wafer to form first pieces; and dividing the second wafer to form second pieces, wherein each second piece is attached to and smaller an a corresponding one of the first pieces.

* * * * *